United States Patent
Arora et al.

(10) Patent No.: US 12,191,825 B2
(45) Date of Patent: Jan. 7, 2025

(54) DYNAMIC CONTROL OF OUTPUT DRIVER IN A SWITCHING AMPLIFIER

(71) Applicant: Diodes Incorporated, Plano, TX (US)

(72) Inventors: Rohit Arora, Dallas, TX (US); Dharma R. Kadam, Plano, TX (US)

(73) Assignee: DIODES INCORPORATED, Plano, TX (US)

( * ) Notice: Subject to any disclaimer, the term of this patent is extended or adjusted under 35 U.S.C. 154(b) by 328 days.

(21) Appl. No.: 17/836,880

(22) Filed: Jun. 9, 2022

(65) Prior Publication Data
US 2023/0402976 A1 Dec. 14, 2023

(51) Int. Cl.
H03F 3/217 (2006.01)
H03F 3/183 (2006.01)

(52) U.S. Cl.
CPC ....... *H03F 3/2171* (2013.01); *H03F 2200/03* (2013.01); *H03F 2200/372* (2013.01)

(58) Field of Classification Search
CPC ............... H03F 3/2171; H03F 2200/03; H03F 2200/372; H03F 1/3205; H03F 3/2173; H03F 3/183; H03F 2203/45248
See application file for complete search history.

(56) References Cited

U.S. PATENT DOCUMENTS

| | | | |
|---|---|---|---|
| 6,597,240 B1 | 7/2003 | Walburger et al. | |
| 7,565,468 B2 | 7/2009 | Horowitz et al. | |
| 9,130,560 B2 | 9/2015 | Shook | |
| 9,337,807 B2 | 5/2016 | Hollis et al. | |
| 9,614,517 B2 * | 4/2017 | Krishna | H03K 17/165 |
| 10,044,346 B2 * | 8/2018 | Holzmann | G11C 27/024 |
| 11,038,362 B1 | 6/2021 | Omoumi et al. | |
| 2021/0226592 A1 | 7/2021 | Holzmann | |

FOREIGN PATENT DOCUMENTS

| | | |
|---|---|---|
| JP | 2008022176 A | 1/2008 |
| JP | 2010183241 A | 8/2010 |
| JP | 2016507955 A | 3/2016 |
| JP | 2016208500 A | 12/2016 |
| JP | 2021061663 A | 4/2021 |

OTHER PUBLICATIONS

Office Action and Search Report for Taiwan Patent Application No. 112104707, mailed Feb. 5, 2024, 7 pages.
Japanese Application No. 2023-094829, Notice of Allowance mailed on Aug. 28, 2024, 3 pages.

* cited by examiner

*Primary Examiner* — Hieu P Nguyen
(74) *Attorney, Agent, or Firm* — Kilpatrick Townsend & Stockton LLP

(57) ABSTRACT

An output driver with slew rate control includes an output transistor that includes a control terminal coupled to a switching input signal, a drain node coupled to the output node for coupling to a load device, and a source node coupled to a reference voltage. The output driver also has a slew control circuit including a current source coupled in series at a connection node with parallelly connected first switch transistor and second switch transistor. The connection node is coupled to the control terminal of the output transistor. The first switch transistor has a control terminal coupled to the switching input signal. The second switch transistor has a control terminal that is coupled to either the switching input signal or a dynamically modulated switching input signal, depending on a current direction at the output node.

20 Claims, 10 Drawing Sheets

DYNAMIC CONTROL OF OUTPUT DRIVER IN A SWITCHING AMPLIFIER

BACKGROUND

This invention relates to the field of electronic circuits in audio systems. More particularly, the invention relates to dynamic control techniques for improving device performances. Embodiments of the invention can also be applied to other circuits, such as efficient switched power conversion circuits.

A switching amplifier, also known as a switching amplifier, is an electronic amplifier in which transistors operate as binary switches. They are either fully on or fully off. Switching amplifiers employ rail-to-rail output switching, where, ideally, their output transistors virtually always carry either zero current or zero voltage. Thus, their power dissipation is minimal, and they provide high efficiency over a wide range of power levels. Their advantageous high efficiency has propelled their use in various audio applications, from cell phones to flat screen televisions and home theater receivers. Switching audio power amplifiers are more efficient than class-AB audio power amplifiers. Because of their greater efficiency, switching amplifiers require smaller power supplies and eliminate heat sinks, significantly reducing overall system costs, size, and weight.

Switching audio power amplifiers convert audio signals into high-frequency pulses that switch the output in accordance with the audio input signal. Some switching amplifiers use pulse width modulators (PWM) to generate a series of conditioning pulses that vary in width with the audio signal's amplitude. The varying-width pulses switch the power-output transistors at a fixed frequency. Other switching amplifiers may rely upon other types of pulse modulators. The following discussion will mainly refer to pulse width modulators, but those skilled in the art will recognize that switching amplifiers may be configured with other types of modulators.

FIG. 1 is a simplified schematic diagram illustrating a conventional switching amplifier. As shown in FIG. 1, switching amplifier 100 is a differential amplifier. The differential input audio signals INP and INM are input to comparators 101 and 102, where input signals INP and INM are compared with triangular waves VREF generated from an oscillator 103 to generate PWM signals 106 and 107. PWM signals 106 and 107 are coupled to the gates of transistors M1, M2, M3, and M4, respectively. Differential output signals of the switching amplifier are respectively provided at terminals labeled OUTP and OUTN. As shown in FIG. 1, output terminals OUTP and OUTN are connected to a speaker load 110, which is represented by an inductor L1 and a resistor R1.

FIG. 2 is a waveform diagram illustrating the modulation of signals in the switching amplifier of FIG. 1. As shown in FIG. 2, differential input signals, e.g., audio signals INM and INP, are compared with a triangular reference waveform by two comparators as described above in connection with FIG. 1. The output signals of the comparators are pulse signals at a fixed frequency whose pulse width is proportional to the input signal. Two PWM signals are shown in FIG. 2 as OUTP and OUTN.

Device break down and electromagnetic interference (EMI) are critical issues in switching Audio amplifiers as well as DC-DC switching regulators. Any system which employs Pulse Width Modulation to drive large output transistors with low breakdown voltage devices is susceptible to these issues.

A cause for these problems was the inability of controlling all the signal transition edges during turnoff, resulting in large overshoots and undershoots. The existing art often relies on increasing the dead time or applying extremely slower slew-rate to prevent the EMI and device damage issues. But such designs suffer from slowing down the circuit speed and inferior total harmonic degradation (THD) performance. There is a trade-off in terms of controlling the slew rate for EMI and Device Break Down as well as THD performance as both are inversely related and hence optimal design of the slew control to meet both specification parameters becomes a challenging task.

Accordingly, there is need for improved solutions to the above-mentioned issues.

Definitions

The terms used in this disclosure generally have their ordinary meanings in the art within the context of the invention. Certain terms are discussed below to provide additional guidance to the practitioners regarding the description of the invention. It will be appreciated that the same thing may be said in more than one way. Consequently, alternative language and synonyms may be used.

A switching amplifier, as used herein, refers to an electronic amplifier in which the amplifying devices (transistors, usually MOSFETs) operate as electronic switches, and not as linear gain devices as in other amplifiers. They operate by rapidly switching back and forth between the supply rails, being fed by a modulator using pulse width, pulse density, or related techniques to encode the input into a pulse train. Common types of switching amplifiers include class-D amplifiers and switched mode power control amplifiers.

A class-D amplifier is a type of or switching amplifier, often used in audio amplifier applications.

A switching control signal, or switching signal, as used herein, refers to signals that switch back and forth between the supply rails to control the amplifying devices, as those used in a switching amplifier.

A differential or single-ended amplifier, as used herein, refers to a differential amplifier that amplifies the difference between its two inputs, whereas the single-ended amplifier amplifies the difference between its single input and ground.

Slew rate as used herein refers to the change of voltage or current, or another electrical quantity, per unit of time.

Total harmonic distortion (THD), as used herein, refers to a measurement of how much of the distortion of a voltage or current is due to harmonics in the signal.

An H-bridge circuit as used herein refers to an electronic circuit that switches the polarity of a voltage applied to a load. Its common schematic diagram includes four switching elements configured as the branches of a letter "H" and the load connected as the cross-bar.

Dead-time as used herein refers to the time during which both a high-side transistor and a low-side transistor in a half-bridge switching circuit are turned off.

A power converter is an electrical or electromechanical device for converting electrical energy, such as converting between AC and DC or changing the voltage, current, or frequency, or some combinations of these conversions. A power converter often includes voltage regulation.

A switching regulator, or switch mode power supply (SMPS), uses an active device that switches on and off to maintain an average value of output. In contrast, a linear regulator is made to act like a variable resistor, continuously adjusting a voltage divider network to maintain a constant output voltage and continually dissipating power.

A voltage reference is an electronic device that ideally produces a fixed (constant) voltage irrespective of the loading on the device, power supply variations, temperature changes, and the passage of time.

A reference voltage is a voltage value that is used as a target for a comparison operation.

When the phrase "the same" is used to describe two quantities, it means that the values of two quantities are determined the same within measurement or manufacturing limitations.

BRIEF SUMMARY

The inventors have observed that switching amplifiers are susceptible to device breakdown and EMI issues, and conventional solutions often result in reduced slew rate and degraded THD performance. Embodiments of the invention address these issues by dynamically adjusting the slew rates and maintain the THD performance. Critical signal transition edges are identified by input switching signal and output current detection. Slew control circuits are dynamically turned on only at the critical signal transition edges to avoid overshoots and undershoots to remedy the breakdown and EMI issues. At non-critical output transition edges, slew-rate control is not applied to allow high slew rate edges.

In some embodiments, the slew rate information from the output is coupled with the current direction, so that the drive strength is dynamically adjusted, which results in maintaining good THD performance and would optimally control the slew rate to control the overshoot and undershoot during all transitions (during both turn-off and turn-on) to reduce the EMI.

According to some embodiments of the invention, a switching amplifier circuit includes a first output stage including a first pull-up transistor and a first pull-down transistor connected in series at a first output node between first and second reference voltages. The first pull-up and pull-down transistors have control terminals receiving a first differential switching control signal from a switched modulator. The first output node provides a first differential output signal to a first end of a load device. The switching amplifier circuit also includes a second output stage including a second pull-up transistor and a second pull-down transistor connected in series at a second output node between the first and second reference voltages. The second pull-up and pull-down transistors have control terminals receiving second differential switching control signals from the switched modulator. The second output node provides a second differential output signal to a second end of the load device. The switching amplifier circuit also includes a current direction detection circuit coupled to the first output of the switched modulator and the second output of the switched modulator to determine a direction of an output current and provide a current direction signal to indicate if the output current flows from the first output node to the second output node, or the output current flows from the second output node to the first output node. The switching amplifier circuit also includes first, second, third, and fourth slew control circuits, responsive to the current direction signal, and coupled to the first pull-up transistor, the first pull-down transistor, the second pull-up transistor, and the second pull-down transistor, respectively. The first slew control circuit is activated only during turnoff of the first pull-up transistor when the output current flows from the first output node to the second output node. The second slew control circuit is activated only during turnoff of the first pull-down transistor when the output current flows from the second output node to the first output node. The third slew control circuit is activated only during turnoff of the second pull-up transistor when the output current flows from the second output node to the first output node. The fourth slew control circuit is activated only during turnoff of the second pull-down transistor when the output current flows from the first output node to the second output node.

In some embodiments of the above switching amplifier circuit, a given slew control circuit is coupled to the control terminal of an output transistor, the slew control circuit including a current source coupled in series with parallelly connected first switch transistor and second switch transistor. The first switch transistor has a control terminal coupled to a switching input signal, and the second switch transistor has a control terminal that is coupled to either the switching input signal or a dynamically modulated switching signal that reduces the slew rate, depending on a current direction at the output node.

In some embodiments, the dynamically modulated switching input signal comprises the switching input signal and a first pulse signal determined by a high-pass filter coupled to the output node.

In some embodiments, the second switch transistor is characterized by an on-resistance that is 25% of the on-resistance of the first switch transistor or lower.

In some embodiments, the second switch transistor is characterized by an on-resistance that is 50% of the on-resistance of the first switch transistor or lower.

In some embodiments, the given slew control circuit is a PMOS slew control circuit, in which the first and second switch transistors are PMOS transistors, and the PMOS slew control circuit further includes an OR circuit, which includes a first input node for receiving the switching input signal, a second input node for receiving a current detection signal, and an output node. The PMOS slew control circuit also includes a p-channel MOS transistor having a drain node coupled to the output node of the OR circuit through a resistor and a high-pass filter coupled between the output node of the output transistor and a gate node of the p-channel MOS transistor. The drain of the p-channel MOS transistor provides the dynamically modulated switching input signal. The PMOS slew control circuit also includes a multiplexer configured to select one of the input switching signal and dynamically modulated switching input signal in response to the current direction signal.

In some embodiments, the first pull-up transistor is a PMOS transistor, and the first slew control circuit is a PMOS slew control circuit.

In some embodiments, the second pull-up transistor is a PMOS transistor, and the second slew control circuit is a PMOS slew control circuit.

In some embodiments, the given slew control circuit is an NMOS slew control circuit, in which the first and second switch transistors are NMOS transistors, and the NMOS slew control circuit further includes an AND circuit having a first input node for receiving the switching input signal, a second input node for receiving a current detection signal, and an output node. The NMOS slew control circuit further includes an n-channel MOS transistor having a drain node coupled to the output node of the AND circuit through a resistor, and a high-pass filter coupled between the output node of the output transistor and a gate node of the n-channel MOS transistor. The drain of the n-channel MOS transistor provides the dynamically modulated switching input signal. The NMOS slew control circuit also includes a multiplexer configured to select one of the input switching signal and dynamically modulated switching input signal in response to the current direction signal.

In some embodiments, the first pull-down transistor is an NMOS transistor, and the third slew control circuit is an NMOS slew control circuit.

In some embodiments, the second pull-down transistor is an NMOS transistor, and the fourth slew control circuit is an NMOS slew control circuit.

According to some embodiments of the invention, an output driver with slew rate control includes an output transistor that includes a control terminal coupled to a switching input signal, a drain node coupled to the output node for coupling to a load device, and a source node coupled to a reference voltage. The output driver also has a slew control circuit including a current source coupled in series at a connection node with parallelly connected first switch transistor and second switch transistor. The connection node is coupled to the control terminal of the output transistor. The first switch transistor has a control terminal coupled to the switching input signal. The second switch transistor has a control terminal that is coupled to either the switching input signal or a dynamically modulated switching input signal, depending on a current direction at the output node.

According to some embodiments of the invention, a method for operating an output driver includes controlling an output transistor with a switching input signal at a control terminal of the output transistor and adjusting a turnoff current of the output transistor using a slew control circuit. The slew control circuit includes a current source coupled in series at a connection node with parallelly connected first switch transistor and second switch transistor. The connection node is coupled to the control terminal of the output transistor. The adjusting of the turnoff current includes turning on the first switch transistor using the switching input signal, and turning on the second switch transistor using either the switching input signal or a dynamically modulated switching input signal, depending on a current direction at an output node of the output transistor.

In some embodiments, the above method also includes forming the dynamically modulated switching input by modifying the switching input signal using a pulse signal determined by a high-pass filter coupled to the output node.

In some embodiments, the method also includes configuring the second switch transistor with an on-resistance that is 25% of the on-resistance of the first switch transistor or lower.

In some embodiments, the method also includes comprising generating the dynamically modulated switching input by using delay cells and adding delays according to sensed output signal.

DETAILED DESCRIPTION

Figure 1:
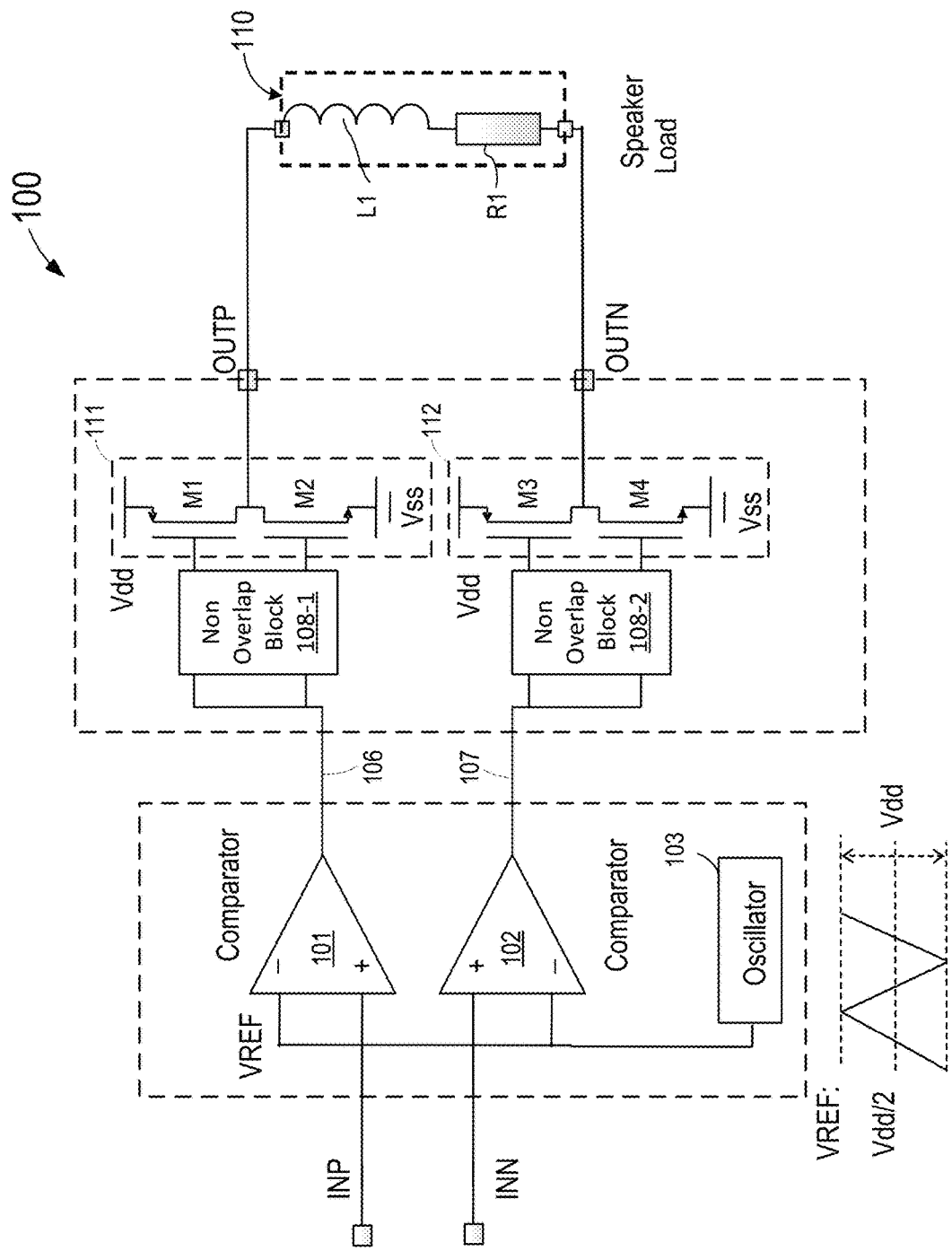
FIG. 1 is a simplified schematic diagram illustrating a conventional switching amplifier.
Figure 3:
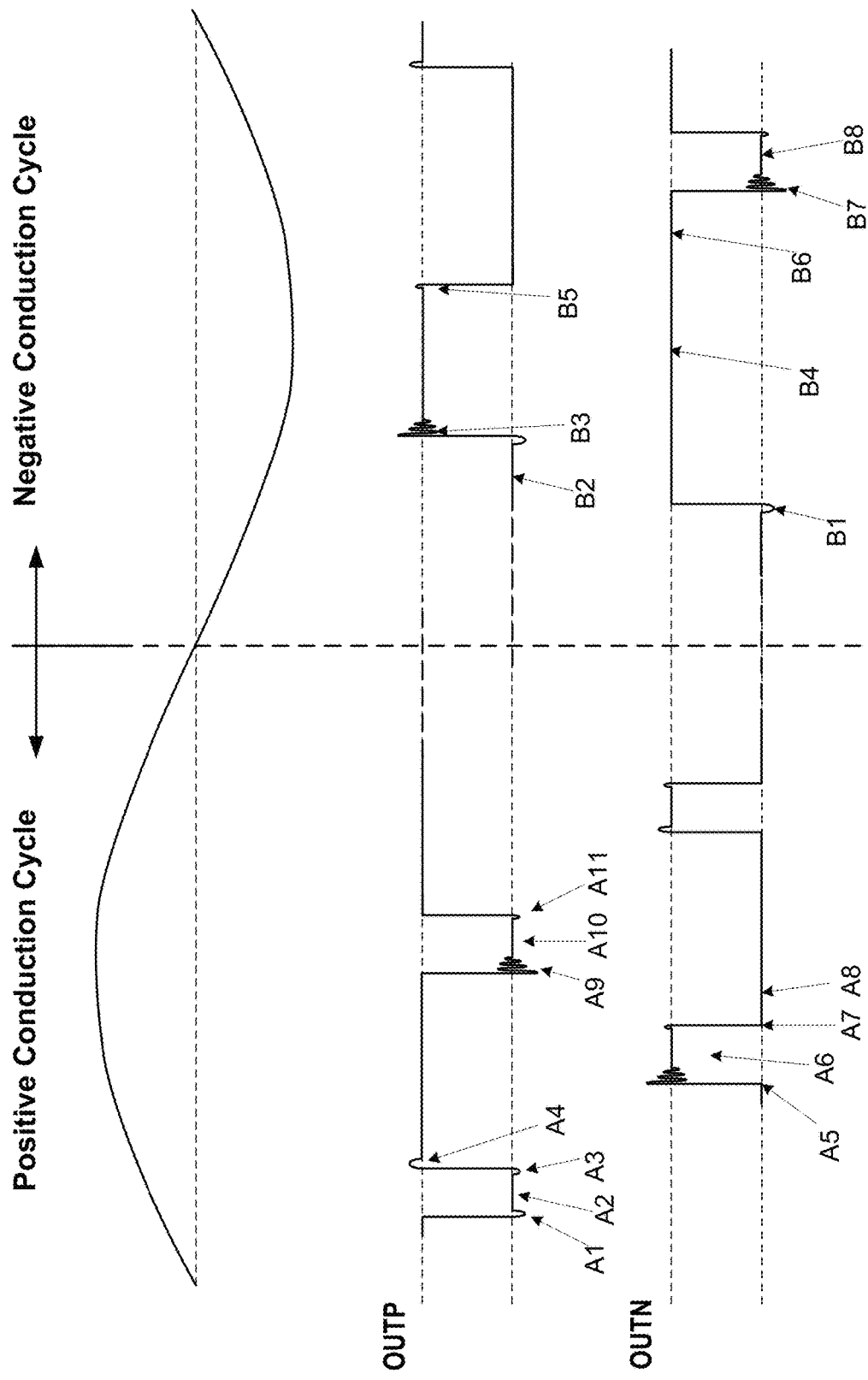
FIG. 3 is a simplified waveform diagram illustrating the issues associated with a conventional switching amplifier according to some embodiments of the present invention.

FIG. 3 is a simplified waveform diagram illustrating some issues associated with a conventional switching amplifier according to some embodiments of the invention. The transition of output signals at nodes OUTP and OUTN in switching amplifier 100 in FIG. 1 are shown in FIG. 3 for both the positive conduction cycle and negative conduction cycle of an input signal, for example an audio signal. The description below refers to the schematic diagram of FIG. 1. A first half bridge 111 has high-side transistor M1 and low-side transistor M2, and a second half bridge 112 has high-side transistor M3 and low-side transistor M4. In the description below, transistors M1 and M2 are also referred to as high-side and low-side transistors, respectively, associated with node OUTP. Similarly, transistors M3 and M4 are also referred to as high-side and low-side transistors, respectively, associated with node OUTN.

In this embodiment, when the input audio signal amplitude is increased, the load current would flow from OUTP to OUTN for a half cycle and then would reverse the direction from OUTN to OUTP for the remaining half cycle. The PWM generation is done in such a way that, when current is flowing from OUTP to OUTN, and the OUTP is going from low to high (turn ON of the PMOS) slewing of OUTP is controlled. But when OUTN is going from low to high (turn OFF of the NMOS) there is no control, and hence will result in the overshoot as shown above in the diagram. This would result in EMI degradation as well as Device Break Down issues.

In FIG. 3, during the input signal positive half cycle of the sinusoidal waveform, the output current flows from output node OUTP to output node OUTN. In the beginning, the first half bridge high-side PMOS transistor M1 is on, and the second half bridge low-side NMOS transistor M4 is on. The regions of interest are marked as A1, A2, . . . , A11.

In region A1, the high-side PMOS transistor is turned off, and only the body diode of the first half bridge low-side NMOS transistor M2 conducts current.

In region A2, low-side NMOS transistor of OUTP M2 is turned on and the current direction is maintained.

In region A3, low-side NMOS transistor, M2 of OUTP turns off and body diode of high-side PMOS transistor, M1 of OUTP, conducts the current and causing an overshoot.

However, this portion is controlled by a current source. In region A4, high-side PMOS transistor, M1 of OUTP turns ON.

In region A5, the low-side NMOS transistor, M4 of second half bridge is turned off, and the body diode of second half bridge, high-side PMOS M3 conducts. This turnoff operation of second half bridge low-side NMOS M4 is not controlled, and the overshoot peak magnitude can be as high as 3 V above the power supply voltage. This overshoot also causes ringing after the peak. The higher peak can cause worse problems with EMI, and the ringing causes degradation in a THD.

In region A6, the second half bridge high-side PMOS transistor is turned on, after the peaking and ringing, and the voltage level settles to Vdd, the power supply voltage.

In region A7, the second half bridge high-side PMOS transistor is off, and the conduction through the body diode of second half bridge PMOS causes a small peak.

In region A8, high-side PMOS transistor, M1 on OUTP is ON and low-side NMOS transistor, M4 on OUTN is turned ON.

In region A9, the switching signal transitions to negative. High-side PMOS transistor M1 on OUTP is off and the body diode of low-side NMOS transistor, M2 on OUTP conducts to maintain current direction. This region is not under control. The peak of the undershoot can be as high as 2V and it also causes ringing. Similar to region, A5, the high peak undershoot voltage causes EMI and the ringing degrades THD.

In region A10, low side NMOS transistor, M2 of OUTP turns on, after a small negative peak, the signal settles down to the ground voltage, same as region A2 and the process repeats from region A1 to A8 for all positive input amplitudes.

As described above in the regions A1-A8 above during the input positive half cycle, region 5 causes the overshoot of output node OUTN when the low-side transistor, M4 on OUTN is turning OFF and the voltage at OUTN swings above VDD due to the inductor current in an uncontrolled manner. Similarly, during region 1 and region 9, the voltage at the output node OUTP swings down when the high-side transistor, M1 on OUTP is OFF, causing an undershoot below GND due to the inductor current in an uncontrolled manner. In regions A1 and A5, similarly in A9, large voltage swings and ringing cause problems of EMI and THD.

Turning to the negative conduction cycle in FIG. 3, the input signal turns negative, and the current direction reverses, going from node OUTN to node OUTP. Eight regions B1-B8 are marked in FIG. 3 and described below.

In region B1, the low-side NMOS transistor, M2 of OUTP is on and the low-side NMOS transistor, M4 of OUTN is off.

In region B2, the low-side NMOS transistor, M2 of OUTP is ON and the high-side PMOS transistor, M3 of OUNT is also ON.

In region B3, the low-side NMOS transistor, M2 of OUTP is OFF, and the body diode of the high-side PMOS transistor, M1 of OUTN conducts current, causing a large upswing, followed by ringing. This is an uncontrolled signal edge, resulting in issues of EMI and THD.

In region B4, the high-side PMOS transistor, M1 of OUTN is turned ON and the voltage on node OUTN settles to VDD.

In region B5, the high-side PMOS transistor, M1 of OUTP is turned OFF.

In region B6, the low-side NMOS transistor, M2 of OUTP is turned ON, the high-side PMOS transistor, M3 of OUTN is also ON. The current still flows from mode OUTN to node OUTP.

In region B7, the high-side PMOS transistor, M3 of OUTN is turned OFF, and the conduction is through the body diode in the low-side NMOS transistor, M4 of OUTN. This is an uncontrolled signal edge, resulting in issues of EMI and THD.

In region B8, the low-side NMOS transistor, M4 of OUTN turns ON and the voltage on node OUTN settles to ground.

As described above, in region B3, large overshoot on OUTP and ringing cause problems of EMI and THD and in region B7, large undershoot on OUTN and ringing cause problems of EMI and THD.

As described above with reference to FIG. 3, the inventors have identified certain signal transition edges that cause issues of EMI and THD, whereas other signal transition edges do not cause these issues. Accordingly, in embodiments of the invention, slew rate control, which slows down the circuit speed, is not applied to all signal transition edges.

In some embodiments, slew rate control is applied to node OUTN during turn-off, when the current direction is from node OUTP to node OUTN. Under this condition, the low-side NMOS transistor pull down transistor is turned off, current flows through the body diodes of the NMOS transistor. Similarly, during a negative half cycle of the input signal, the current direction is from node OUTN to node OUTP. Slew rate control is applied to node OUTP turnoff; when the low-side NMOS transistor, M2 of OUTP turns OFF, current flows through the body diode of the high-side PMOS transistor, M1 of OUTP. Put another way, in the negative half cycle, slew control is applied to node OUTP during turn-off, when the current direction is from node OUTN to node OUTP.

The two scenarios described above refer to using slew rate control to remedy the overshoot and ringing issues, as shown in regions A5 and B3 in FIG. 3. Similarly, the issues of EMI and THD can also occur during signal undershoot and ringing. For example, in region A1, similar to A9, which exhibits undershoot, slew rate control is applied to high-side PMOS transistor, M1 of OUTP, with current direction from node OUTP to node OUTN. In this region, the high-side PMOS transistor, M1 of OUTP is turned off, and the current flows away from the PMOS transistor. In region B7, the current direction is from node OUTN to node OUTP. Here, the slew rate control is applied to node OUTN during turnoff of the high-side PMOS transistor, M3 of OUTN, and the current flows away from the PMOS transistor.

As described above, the inventors have identified certain signal transition edges that can lead to excessive overshoot or undershoot and signal ringing that can damage the device or degrade device performance. However, certain other signal transition edges do not produce such excess overshoot or undershoot. Therefore, embodiments of the invention teach selectively or dynamically apply slew rate control only at the critical signal transition edges, but not all signal transition edges. In contrast, applying slew rate control at all transition edges, as described in some conventional examples, would unnecessarily slow down circuit speed and reduce circuit performance.

Figure 2:
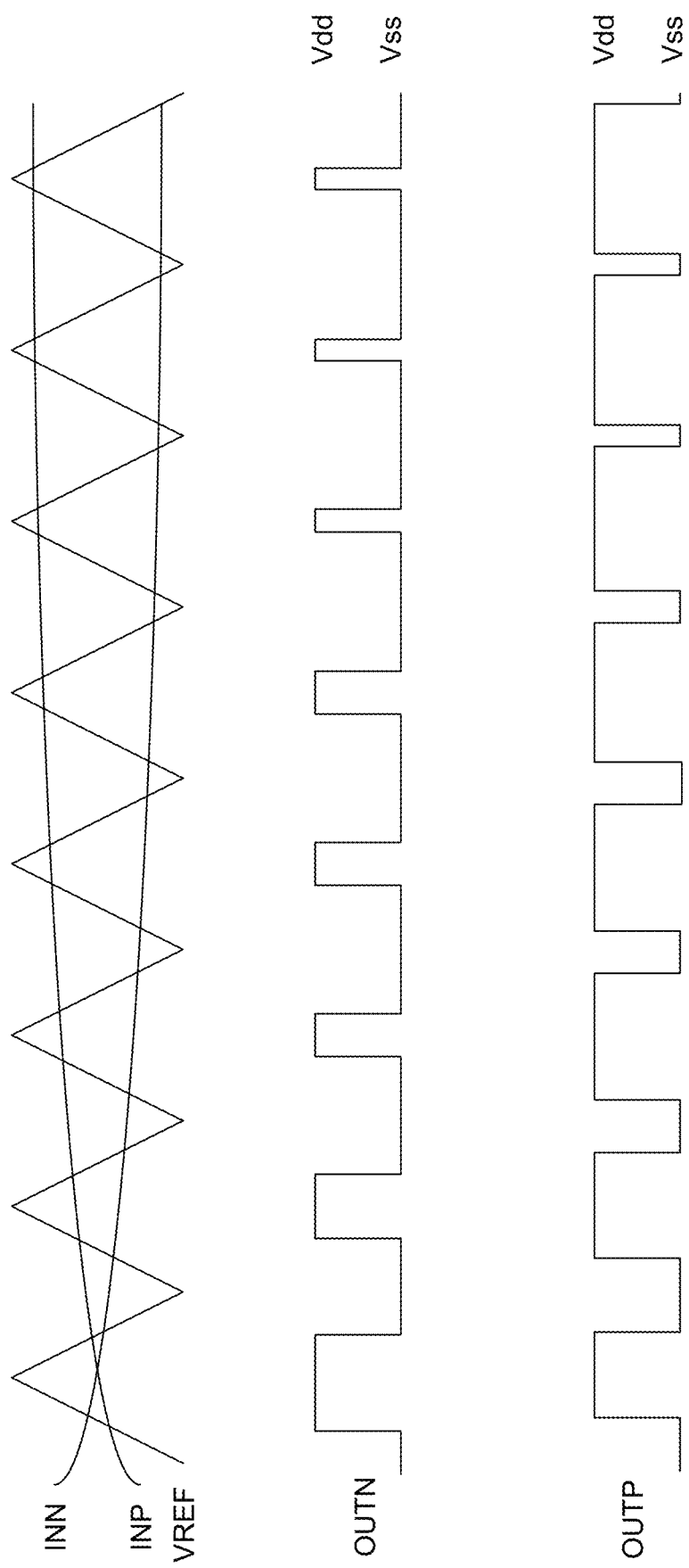
FIG. 2 is a waveform diagram illustrating the modulation of signals in the switching amplifier of FIG. 1.
Figure 4:
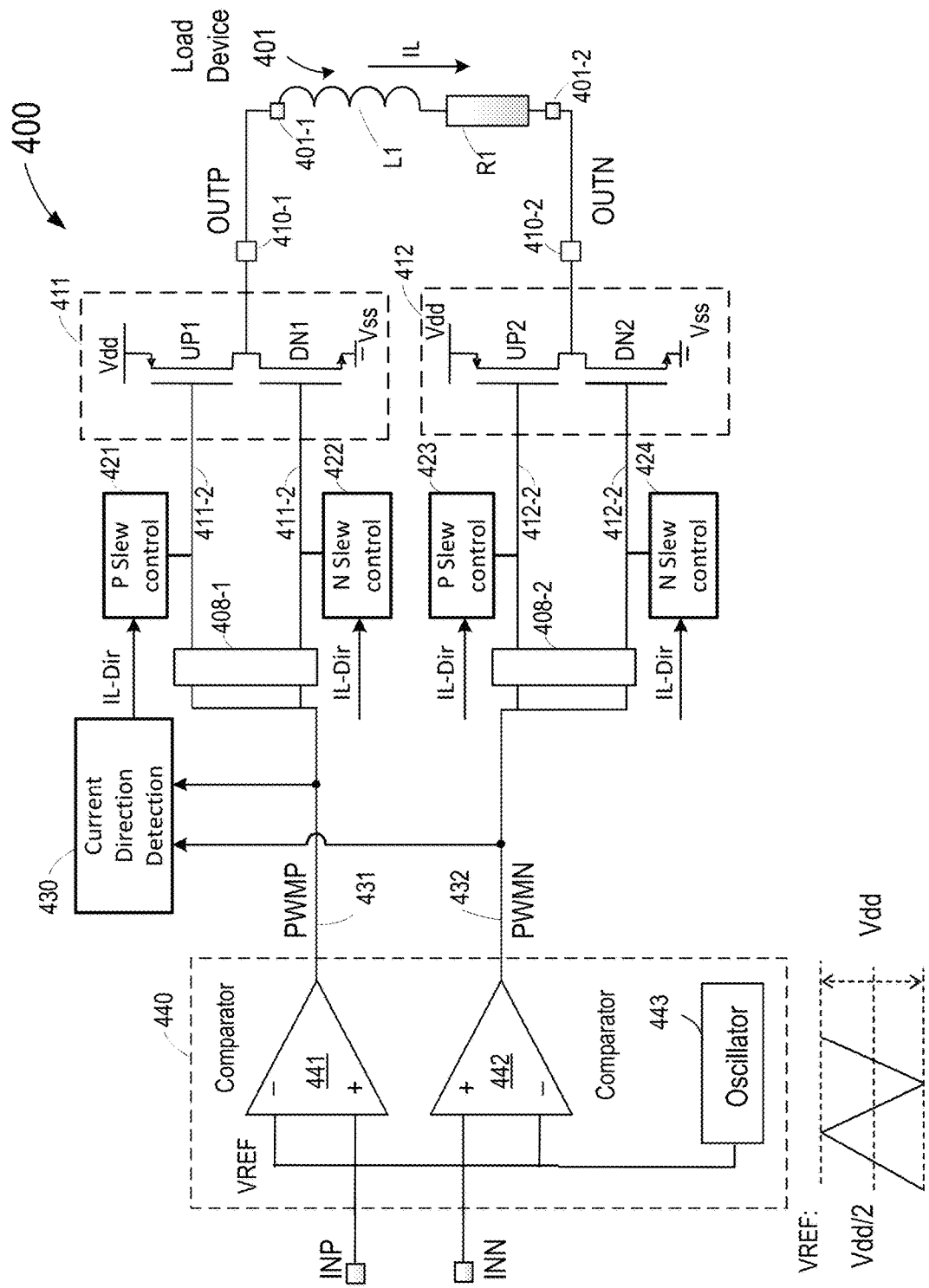
FIG. 4 is a simplified schematic diagram illustrating a switching driver circuit with dynamic slew-rate control according to some embodiments of the invention.

FIG. 4 is a simplified schematic diagram illustrating a switching amplifier circuit with dynamic slew-rate control according to some embodiments of the invention. As shown in FIG. 4, a switching amplifier circuit 400 includes a first push-pull output stage 411, also referred to as the first half-bridge, including a first pull-up transistor UP1 and a first pull-down transistor DN1 connected in series at a first output node OUTP between first and second reference voltages Vdd and Vss, which, in some embodiments, can be provided by a power supply terminal and a ground terminal. The first pull-up and pull-down transistors have control terminals 411-1 and 411-2 receiving a first differential switching control signal 431 from a switched modulator 440, which includes two comparators 441 and 442 and an oscillator 443. The first output node OUTP provides a first differential output signal 410-1 to a first end 401-1 of a load device 401. In the example of FIG. 4, load device 401 is an audio speaker represented by an inductor L1 and a resistor R1. In this example, switched modulator 430 is similar to the PWM signal generator described above in connection to FIGS. 1 and 2.

Switching amplifier circuit 400 also includes a second push-pull output stage 412, also referred to as the second half-bridge, comprising a second pull-up transistor UP2 and a second pull-down transistor DN2 having conduction paths connected in series between the first and second reference voltages Vdd and Vss and defining a second output node OUTN at the connection between the conduction paths, each of the second pull-up and pull-down transistors having control terminals receiving second differential switching control signals 432 from the switched modulator 430, the second output node OUTN providing a second differential output signal 410-2 to a second end 401-2 of the load device 401.

Switching amplifier circuit 400 also includes a current direction detection circuit 430 coupled to the PWMP control 431 for OUTP and the PWMN control 432 for OUTN to determine the direction of an output current IL and provide a current direction signal IL-Dir to indicate if the output current flows from the first output node OUTP to the second output node OUTN, or the output current flows from the second output node OUTN to the first output node OUTP. In some embodiments, the current direction signal IL-Dir is positive if the output current flows from the first output node OUTP to the second output node OUTN, and the current direction signal IL-Dir is negative if the output current flows from the second output node OUTN to the first output node OUTP.

Moreover, switching amplifier circuit 400 also has first, second, third, and fourth slew control circuits 421, 422, 423, and 424, responsive to the current direction signal IL-Dir, and coupled to the control terminals of the first pull-up transistor UP1, the first pull-down transistor DN1, the second pull-up transistor UP2, and the second pull-down transistor DN2, respectively. The slew control circuits are configured to lower the slew rate at an output node at the critical conditions described below. The first slew control circuit 421 is activated only during turnoff of the first pull-up transistor UP1 when the output current flows from the first output node OUTP to the second output node OUTN. The second slew control circuit 422 is activated only during turnoff of the first pull-down transistor DN1 when the output current flows from the second output node OUTN to the first output node OUTP. The third slew control circuit 423 is activated only during turnoff of the second pull-up transistor UP2 when the output current flows from the second output node OUTN to the first output node OUTP. The fourth slew control circuit 424 is activated only during turnoff of the second pull-down transistor DN2 when the output current flows from the first output node OUTP to the second output node OUTN.

Figure 5:
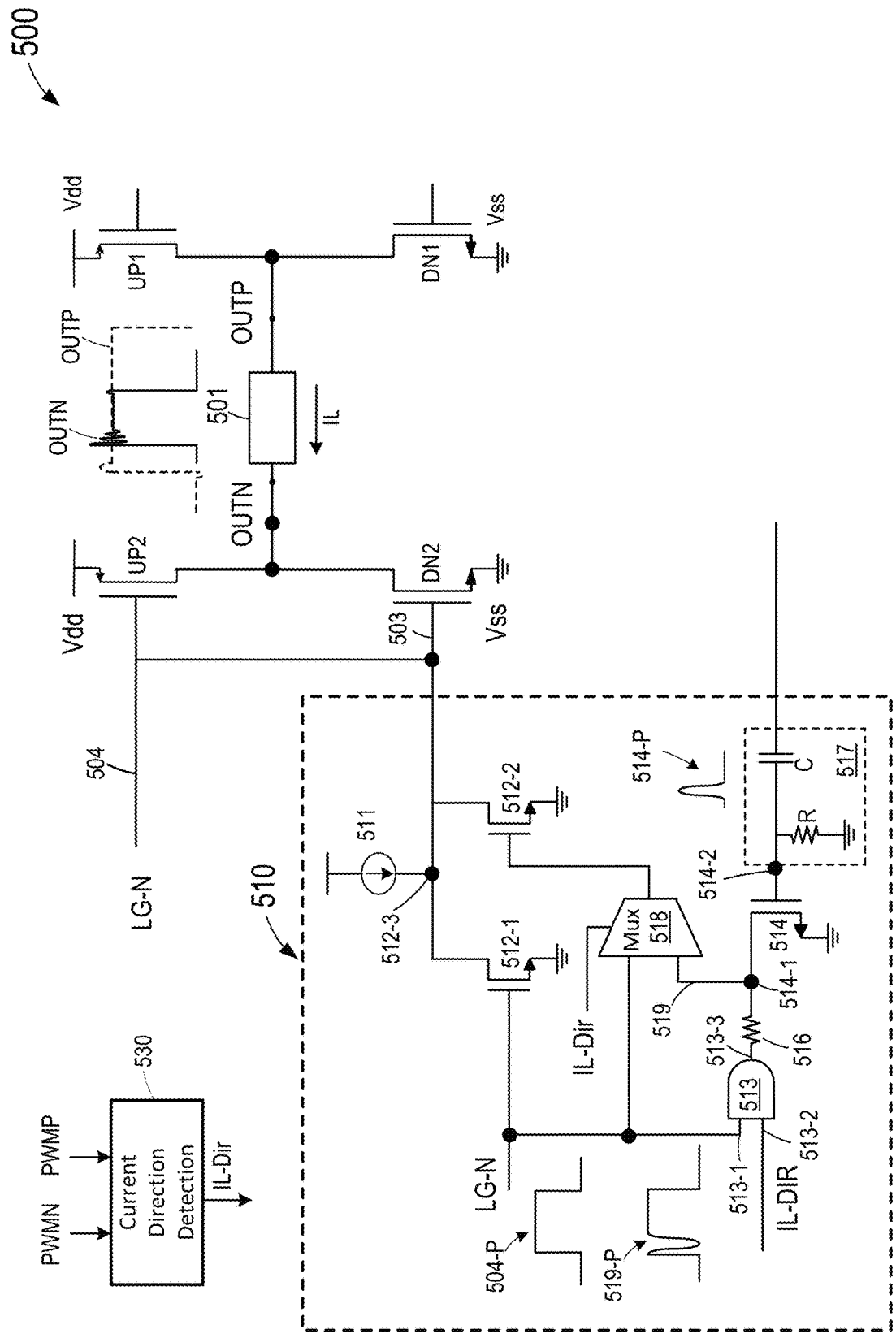
FIG. 5 is a simplified schematic diagram illustrating a switching amplifier circuit with a slew control circuit according to some embodiments of the invention.
Figure 6:
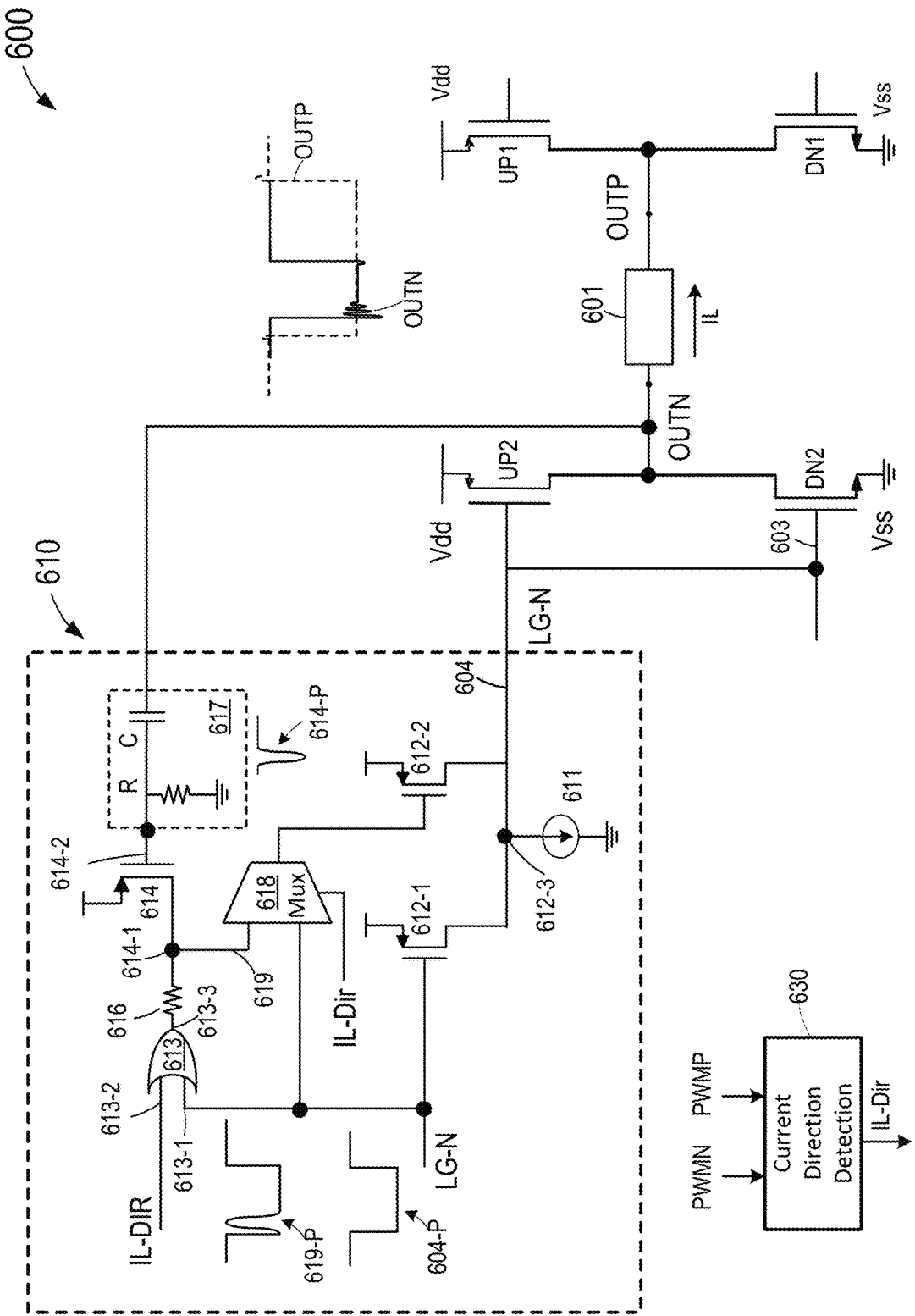
FIG. 6 is a simplified schematic diagram illustrating a switching amplifier circuit with a slew control circuit according to some embodiments of the invention.

Examples of the slew control circuits are described below in connection to FIGS. 5 and 6. FIG. 5 illustrates an NMOS slew control circuit, and FIG. 6 illustrates a PMOS slew control circuit. In the switching amplifier circuit 400 in FIG. 4, the first pull-up transistor UP1 is a PMOS transistor, and the first slew control circuit 421 is a PMOS slew control circuit. The second pull-up transistor UP2 is a PMOS transistor, and the third slew control circuit 423 is a PMOS slew control circuit. The first pull-down transistor DN1 is an NMOS transistor, and the second slew control circuit 422 is an NMOS slew control circuit. The second pull-down transistor DN2 is an NMOS transistor, and the fourth slew control circuit 424 is an NMOS slew control circuit.

In summary, to dynamically control the turnoff of the output transistor, a high-pass filter translates the rate at which the output voltage rises into a transient spike, which is coupled with the signal from the switched input signal, so that the turnoff of the output transistor is carried out dynamically. As a result, the EMI and overshoot issues are significantly improved. In addition, for filterless switching PWM applications, this design also reduces device breakdown. Further, the pull-down or pull-up current is divided into two parts; one is weak and the other is strong, and these two parts dynamically control the slew rate based on the current direction.

FIG. 5 is a simplified schematic diagram illustrating a switching amplifier circuit with a slew control circuit according to some embodiments of the invention. FIG. 5 shows a portion of a switching amplifier circuit 500, which could be an example of the switching amplifier circuit 400 of FIG. 4. As shown in FIG. 5, switching amplifier circuit 500 includes differential output nodes OUTP and OUTN, on both sides of a load device 501. Similar to switching amplifier circuit 400 of FIG. 4, switching amplifier circuit 500 has an H-Bridge configuration, with high-side pull-up transistor UP1 and pull-down transistor DN1, and low-side pull-up transistor UP2 and pull-down transistor DN2. As shown in FIG. 5, pull-down transistor DN2 is an NMOS output transistor.

As shown in FIG. 5, pull-down transistor DN2 is an output transistor that includes a control terminal 501 coupled to a switching input signal LG-N, which is a switched control signal, which could be derived from a PWM modulator, similar to switched control signal 432 in FIG. 4. Transistor DN2 also has a drain node coupled to output node OUTN for coupling to a load device and a source node coupled to a reference voltage Vss, which, in this example, is provided by a ground node. Switching driver circuit 500 also includes a current direction detection circuit 530, which is similar to current direction detection circuit 430 in FIG. 4. Current direction detection circuit 530 is coupled to output node OUTP and node OUTN provides a current direction signal IL-Dir indicating the direction of the current in load device 501 between output nodes OUTP and OUTN.

Switching driver circuit also includes a slew control circuit 510 that includes a current source 511 coupled in series at a connection node with parallelly connected first switch transistor 512-1 and second switch transistor 512-2, the connection node 512-3 coupled to the control terminal 503 of transistor DN2. The first switch transistor 512-1 has a control terminal coupled to the switching input signal LG-N. The second switch transistor 512-2 has a control terminal that is coupled to either the switching input signal LG-N or a dynamically modulated switching input signal 519, depending on a current direction at the output node OUTN. As shown in FIG. the current direction is provided by the current direction signal IL-Dir provided by current direction detection circuit 530.

In the example of FIG. 5, the output transistor DN2 is an NMOS transistor, and the slew control circuit 510 further incudes an AND circuit 513 having a first input node 513-1 for receiving the switching input signal LG-N, a second input node 513-2 for receiving a current detection signal IL-Dir, and an output node 513-3. Slew control circuit 510 further incudes an n-channel MOS transistor 514 having a drain node 514-1 coupled to the output node of the AND circuit 513 through a resistor 514, and a high-pass filter 517 coupled between the output node OUTN of the output transistor DN2 and a gate node 514-2 of the n-channel MOS transistor. The drain node 514-1 of the n-channel MOS transistor 514 provides the dynamically modulated switching signal 519. A multiplexer circuit 518 is configured to select one of the input switching signal LG-N and the dynamically modulated switching input signal 519 in response to the current direction signal IL-DIR. In this configuration, the second switch transistor 512-2 receives either the switching input signal LG-N or a dynamically modulated switching input signal 519, depending on a current direction at the output node OUTN.

FIG. 5 also illustrates relevant waveforms. High-pass filter 517 is made up of a capacitor C and a resistor R, and produces a pulse signal 514-P at the node 514-2 of transistor 514. The input switching signal LG-N is shown as a pulse signal 504-P. The dynamically modulated switching input signal 519 is shown by the waveform 519-P. It can be seen that the dynamically modulated switching input signal 519-P includes the switching input signal 504-P and a negative pulse signal 514-P determined by a high-pass filter coupled to the output node OUTN. The negative pulse signal 514-P is produced by high-pass filter 517 during the turn-off of transistor DN2. When the current direction signal IL-Dir indicates that the load current IL is flowing into output node OUTN, the gate node of second switch transistor 512-2 receives the dynamically modulated switching input signal 519-P, which slows down the turnoff of transistor DN2 and provides slew rate control to reduce electromagnetic interference (EMI) and total harmonic distortion (THD). During other times, both the first switch transistor 512-1 and 512-2 receive the switching input signal LG-N at its full strength and allow transistor DN2 to turnoff efficiently without a loss of speed.

In some embodiments, resistor 516 in slew control circuit 510 provides a high impedance, e.g., 20 KΩ, so the direct output 513-3 of the AND gate 513 maintains the same voltage as the switched signal LG-N, while allowing node 514-1 to be pulled down by the high-pass filter 17. In the high-pass filter 517, the RC time constant is set at about 5 nsec in some embodiments, similar to the slew time of the signal at node OUTN.

In some embodiments, the second switch transistor 512-2 is configured to provide more current drive capability than the first switch transistor 512-2. For example, the second switch transistor 512-2 may have the same channel length but may be twice as wide as the first switch transistor 512-2, in which case, the second switch transistor 512-2 is characterized by an on-resistance that is 50% of the on-resistance of the first switch transistor 512-1, or lower. In other embodiments, the second switch transistor 512-2 is characterized by an on-resistance that is 25% of the on-resistance of the first switch transistor 512-1, or lower. In yet other embodiments, the second switch transistor 512-2 is characterized by an on-resistance that is 25% or lower than the on-resistance of the first switch transistor 512-1.

FIG. 6 is a simplified schematic diagram illustrating a switching amplifier circuit with a slew control circuit according to some embodiments of the invention. FIG. 6 shows a portion of a switching driver circuit 600, which is similar to the switching amplifier circuit 500 of FIG. 5, but with a slew control circuit for the PMOS output transistor. In contrast, switching amplifier circuit 500 of FIG. 5 has a slew control circuit for an NMOS output transistor. As explained in more detail below, slew control circuit 610 in FIG. 6 is similar to slew control circuit 510 in FIG. 5, with circuit details reflecting the difference between PMOS and NMOS. For example, NMOS transistors in slew control circuit 510 are replaced by PMOS transistors in slew control circuit 610. Similarly, the AND gate circuit is replaced by an OR gate circuit, the power terminal is replaced by the ground terminal, etc. For completeness, a detailed description is presented below.

As shown in FIG. 6, switching driver circuit 600 includes differential output nodes OUTP and OUTN, on both sides of a load device 601. Similar to switching amplifier circuit 400 of FIG. 4, switching driver circuit 600 has an H-Bridge configuration, with high-side pull-up transistor UP1 and pull-down transistor DN1, and low-side pull-up transistor UP2 and pull-down transistor DN2. As shown in FIG. 6, pull-up transistor DP2 is a PMOS output transistor.

As shown in FIG. 6, pull-up transistor DP2 is an output transistor that includes a control terminal coupled to a switching input signal LG-N, which is a switched control signal, which could be derived from a PWM modulator, similar to switched control signal 432 in FIG. 4. Transistor DP2 also has a drain node coupled to output node OUTN for coupling to a load device and a source node coupled to a reference voltage Vss, which, in this example, is provided by a ground node. Switching driver circuit 600 also includes a current direction detection circuit 630, which is similar to current direction detection circuit 430 in FIG. 4. Current direction detection circuit 630 is coupled to output node OUTP and node OUTN provides a current direction signal IL-Dir indicating the direction of the current in load device 601 between output nodes OUTP and OUTN.

The switching driver circuit also includes a slew control circuit 610 that includes a current source 611 coupled in series at a connection node with parallelly connected first switch transistor 612-1 and second switch transistor 612-2, the connection node 612-3 coupled to the control terminal 603 of transistor DP2. The first switch transistor 612-1 has a control terminal coupled to the switching input signal LG-N. The second switch transistor 612-2 has a control terminal that is coupled to either the switching input signal LG-N or a dynamically modulated switching input signal 619, depending on a current direction at the output node OUTN. As shown in FIG. 6, the current direction is provided by the current direction signal IL-Dir provided by current direction detection circuit 630.

In the example of FIG. 6, the output transistor DP2 is a PMOS transistor, and the slew control circuit 610 further incudes an OR circuit 613 having a first input node 613-1 for receiving the switching input signal LG-N, a second input node 613-2 for receiving a current detection signal IL-Dir, and an output node 613-3. Slew control circuit 610 further incudes a p-channel MOS transistor 614 having a drain node 614-1 coupled to the output node of the AND circuit 613 through a resistor 616, and a high-pass filter 617 coupled between the output node OUTN of the output transistor DN2 and a gate node 614-2 of the n-channel MOS transistor. The drain node 614-1 of the p-channel MOS transistor 614 provides the dynamically modulated switching signal 619. A multiplexer circuit 618 is configured to select one of the input switching signal LG-N and the dynamically modulated switching input signal 619 in response to the current direction signal IL-DIR. In this configuration, the second switch transistor 612-2 receives either the switching input signal LG-N or a dynamically modulated switching input signal 619, depending on a current direction at the output node OUTN.

FIG. 6 also illustrates relevant waveforms. High-pass filter 617 is made up with a capacitor C and a resistor R, and produces a pulse signal 614-P at node 614-2 of transistor 614. The input switching signal LG-N is shown as a pulse signal 604-P. The dynamically modulated switching input signal 619 is shown by the waveform 619-P. It can be seen that the dynamically modulated switching input signal 619-P includes the switching input signal 604-P and a transient positive pulse superimposed on it, resulted by the generation of a negative pulse 614-P on the gate of PMOS transistor 614, the width of it is determined by a high-pass filter coupled to the output node OUTN. The negative pulse signal 614-P is produced by high-pass filter 617 during the turn-off of transistor DP2. When the current direction signal IL-Dir indicates that the load current IL is flowing into output node OUTN, the gate node of second switch transistor 612-2 receives the dynamically modulated switching input signal 619-P, which slows down the turnoff of transistor DP2 and provides slew rate control to reduce electromagnetic interference (EMI) and total harmonic distortion (THD). During other times, both first switch transistor 612-1 and second switch transistor 612-2 receive the switching input signal LG-N at its full strength and allow transistor DN2 to turnoff efficiently without a loss of speed.

In some embodiments, the second switch transistor 612-2 is configured to provide more current drive capability than the first switch transistor 612-2. For example, the second switch transistor 612-2 may have the same channel length but be twice as wide as the first switch transistor 612-2, in which case, the second switch transistor 612-2 is characterized by an on-resistance that is 50% of the on-resistance of the first switch transistor 612-1, or lower. In other embodiments, the second switch transistor 612-2 is characterized by an on-resistance that is 25% of the on-resistance of the first switch transistor 612-1, or lower. In yet other embodiments, the second switch transistor 612-2 is characterized by an on-resistance that is 25% or lower than the on-resistance of the first switch transistor 612-1.

As described above, slew control circuitry 510 in FIG. 5 is an example of NMOS slew control circuit 424 switching amplifier circuit 400 in FIG. 4, and slew control circuitry 610 in FIG. 6 is an example of PMOS slew control circuit 423 in switching amplifier circuit 400 in FIG. 4. Similarly, slew control circuitry 510 in FIG. 5 is an example of NMOS slew control circuit 422 switching amplifier circuit 400 in FIG. 4, and slew control circuitry 610 in FIG. 6 is an example of PMOS slew control circuit 421 in switching amplifier circuit 400 in FIG. 4.

Figure 7:
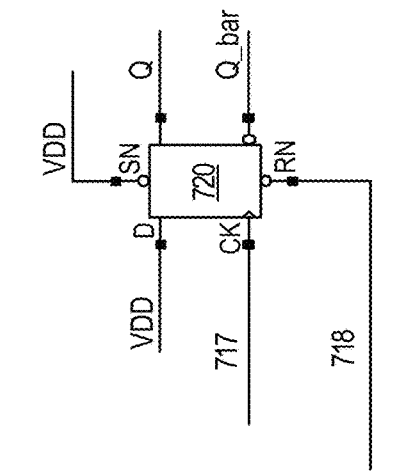
FIG. 7 is a simplified schematic diagram of a current direction detection circuit according to some embodiments of the invention.
Figure 7:
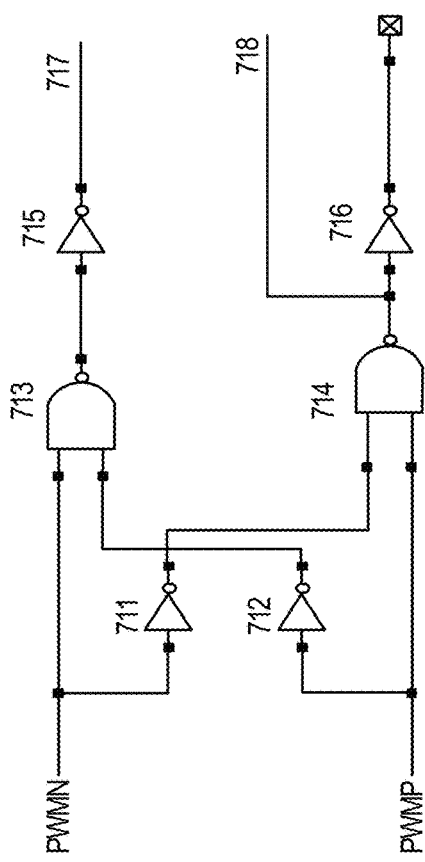

FIG. 7 is a simplified schematic diagram of a current direction detection circuit according to some embodiments of the invention. Current direction detection circuit 700 is an example of the current direction detection circuits 430 in FIG. 4, current direction detection circuits 530 in FIG. 5, and current direction detection circuits 630 in FIG. 6. As shown in FIG. 7, current direction detection circuit 700 receives gate pre-drive signals PWMN and PWMP as inputs. Alternatively, in some embodiments, current direction detection circuit 700 receives signals at output nodes OUTN and OUTP to determine the current direction. Current direction detection circuit 700 includes inverters 711, 712, 715, and 716 coupled to NAND circuits 713 and 714, that produce intermediate signals 717 and 718. Intermediate signals 717 and 718 are coupled to a D-flipflop 720, which is also coupled to VDD, and provides outputs Q and Q-bar. Current direction detection circuit 700 inputs OUTP and OUTN gate pre-drive signals and determines which is leading and lagging, and then generates a flip-flop output Q, which indicates the current direction based on OUTP or OUTN signal comes first. As described above in connection with FIG. 3, during a positive half cycle, the signal at node OUTP comes first, and during a negative half cycle, the signal at node OUTN comes first.

Figure 8:
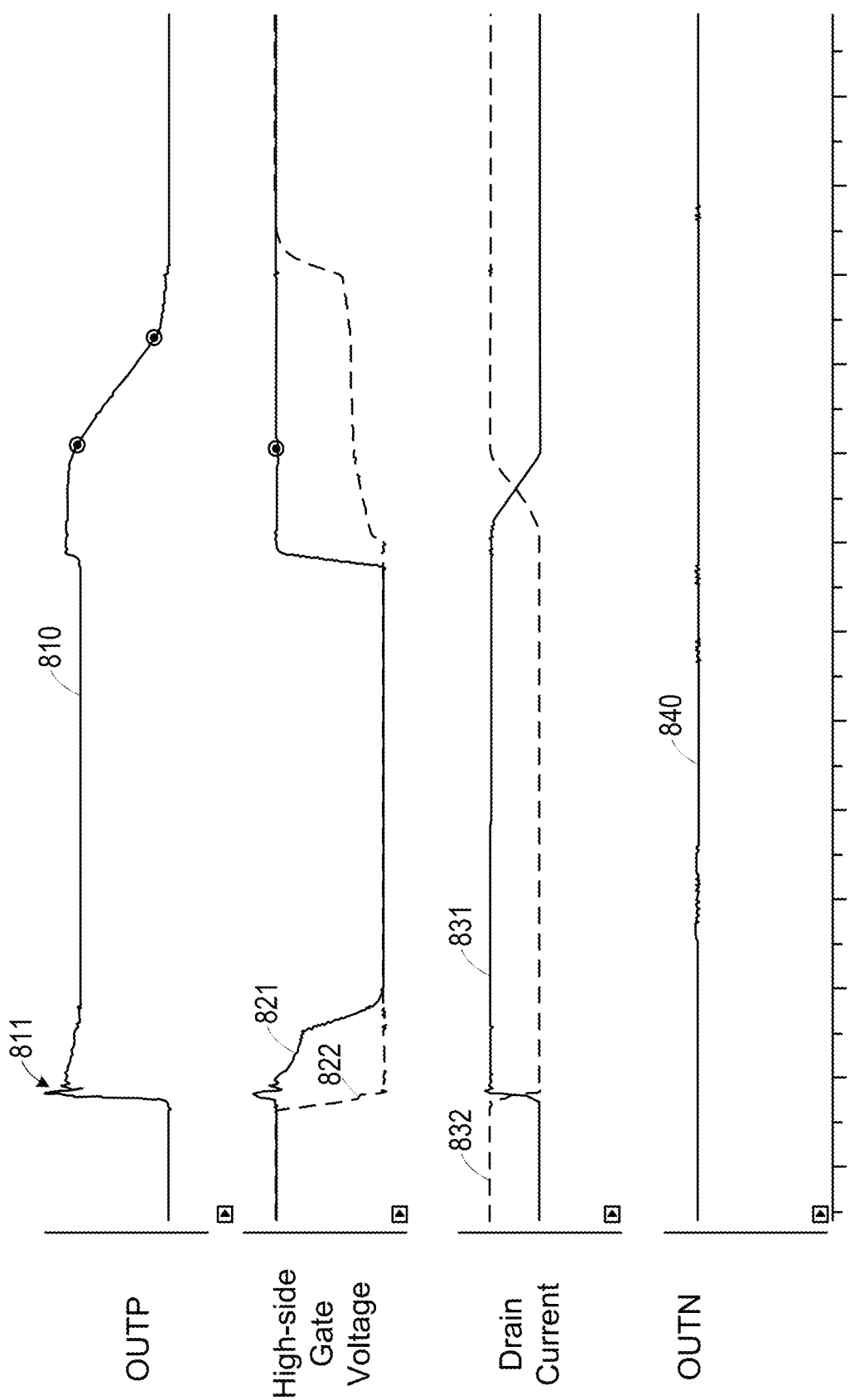
FIG. 8 is a waveform diagram illustrating simulated waveforms of a switching amplifier circuit without dynamic slew rate control according to some embodiments of the invention.

FIG. 8 is a waveform diagram illustrating simulated waveforms of a switching amplifier circuit without dynamic slew rate control according to some embodiments of the invention. The horizontal axis shows the time, and the vertical axis shows the waveform of the signals. In FIG. 8, curve 810 is the signal at node OUTP. Curves 821 and 822 are the gate voltages of the high-side PMOS transistor and NMOS transistor, respectively, that drive the node OUTP. Curves 831 and 832 are the gate voltages of the low-side PMOS transistor and NMOS transistor, respectively, that drive the node OUTP. Curve 840 shows the signal at node OUTN. On curve 810, region 811 shows an uncontrolled edge of the signal, with a peak that is about 6.5 V and additional ringing, which can cause device damage, as well as EMI and THD.

Figure 9:
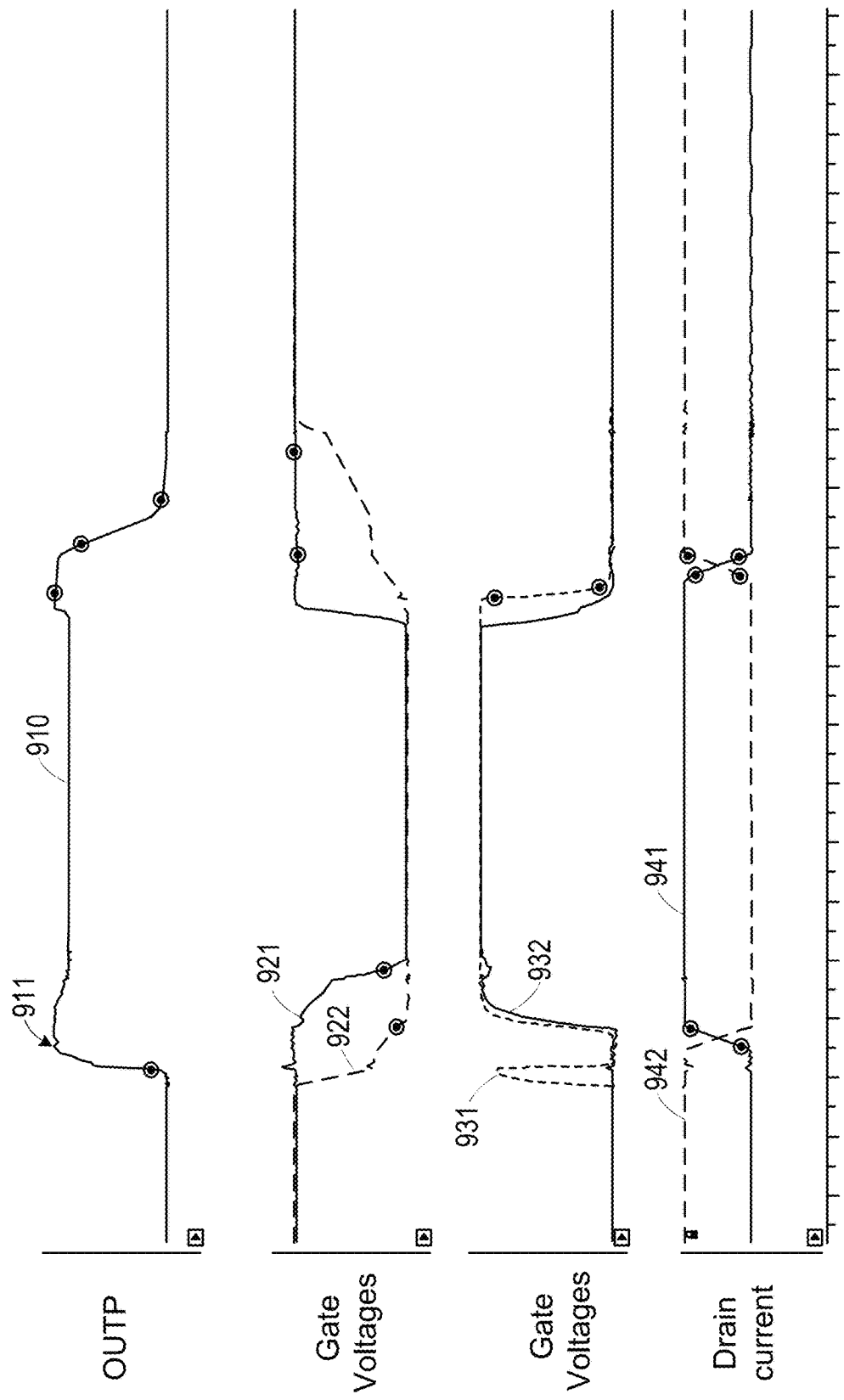
FIG. 9 is a waveform diagram illustrating simulated waveforms of a switching amplifier circuit with dynamic slew rate control according to some embodiments of the invention.

FIG. 9 is a waveform diagram illustrating simulated waveforms of a switching amplifier circuit with dynamic slew rate control according to some embodiments of the invention. In FIG. 9, the horizontal axis shows the time, and the vertical axis shows the waveform of the signals. In FIG. 9, curve 910 is the signal at node OUTP. Curves 921 and 922 are the gate voltages of the high-side PMOS transistor and the low-side NMOS transistor, respectively, that drive the node OUTP. Curve 931 is a pre-gate drive signal to the low-side NMOS transistor provided by the slew control circuit, as described above in connection to FIG. 4. Curve 932 is the gate voltage of the low-side NMOS transistor that drives the node OUTP. Curves 941 and 942 illustrate drain current waveforms. It can be seen on curve 910, region 911 shows a controlled edge of the signal. The overshoot is reduced to approximately a diode voltage above the supply which is shown in the marker as 5.96V for a 5.5V supply. In this case, device damage, as well as EMI and THD issues, are avoided.

Figure 10:
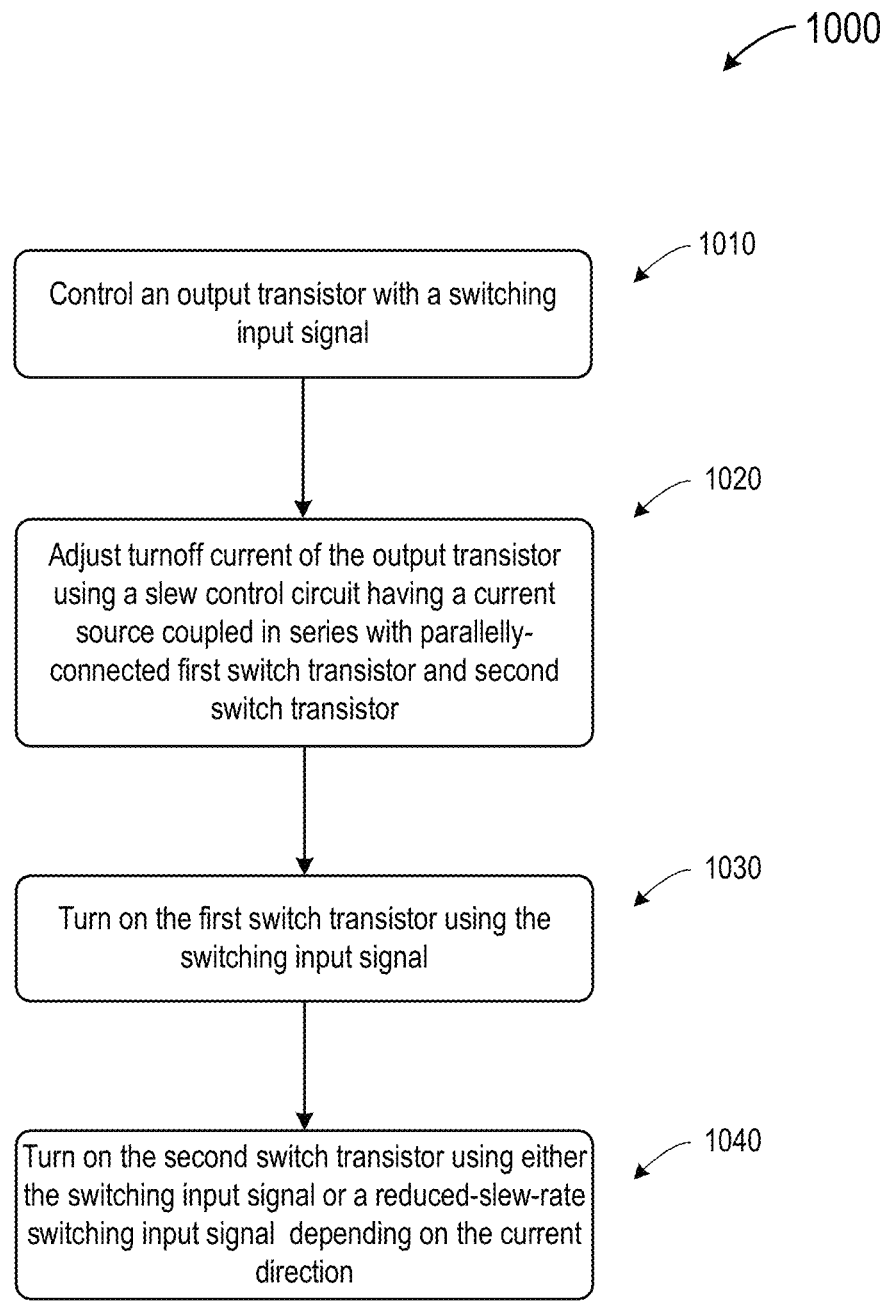
FIG. 10 is a simplified flowchart illustrating a method for operating an output driver according to some embodiments of the invention.

FIG. 10 is a simplified flowchart illustrating a method for operating an output driver according to some embodiments of the invention. The flowchart in FIG. 10 outlines a method 1000 for operating an output driver. An example of the output driver is described above with reference to FIGS. 1-9. For example, switching driver circuit 400 is an example of a differential output driver with dynamic slew rate control. The methods described above can also be described using a single-ended example with reference to FIG. 10, as follows.

At 1010, the method includes controlling an output transistor with a switching input signal at a control terminal of the output transistor. As an example, in FIG. 4, output transistor DN2 is controlled with a switching input signal 432 at a control terminal of the output transistor DN2. In FIG. 4, output transistor DN2 is controlled with a switching input signal LG-N.

At 1020, the method includes adjusting a turnoff current of the output transistor using a slew control circuit including a current source coupled in series at a connection node with parallelly connected first switch transistor and a second switch transistor with the connection node coupled to the control terminal of the output transistor. An example is described above in connection with FIG. 5. Slew control circuit 510 includes a current source 511 coupled in series at a connection node 512-3 with parallelly connected first switch transistor 512-1 and a second switch transistor 512-2. The connection node 512-3 is coupled to the control terminal of the output transistor DN2.

At 1030, the method includes turning on the first switch transistor 512-1 using the switching input signal LG-N.

At 1040, the method includes turning on the second switch transistor 512-2 using either the switching input signal LG-N or a dynamically modulated switching input signal 519, depending on the current direction at an output node OUTN of the output transistor DN2.

In some embodiments, the method also includes forming the dynamically modulated switching input by modifying the switching input signal using a negative pulse signal determined by a high-pass filter coupled to the output node. An example of the dynamically modulated switching input is shown and described in connection with FIG. 5, in which the dynamically modulated switching input 519 is formed by modifying the switching input signal LG N using a negative pulse signal 514-2 determined by a high-pass filter 517 coupled to the output node OUTN. The negative pulse signal is produced using a high-pass filter coupled to the output node.

In some embodiments, the method includes configuring the second switch transistor 512-2 with an on-resistance that is 25% or lower than the on-resistance of the first switch transistor 512-1. In some embodiments, the method includes configuring the second switch transistor 512-2 with an on-resistance that is 50% or lower than the on-resistance of the first switch transistor 512-1.

The features of several embodiments are described above to highlight some aspects of the present disclosure. It is understood that the examples and embodiments described herein are for illustrative purposes only and that various modifications or changes in light thereof will be suggested to persons skilled in the art and are to be included within the spirit and purview of this disclosure.

What is claimed is:

1. A switching amplifier circuit, comprising:
a first output stage, comprising a first pull-up transistor and a first pull-down transistor connected in series at a first output node between first and second reference voltages, each of the first pull-up and pull-down transistors having control terminals and receiving a first differential switching control signal from a switched modulator, the first output node providing a first differential output signal to a first end of a load device;
a second output stage, comprising a second pull-up transistor and a second pull-down transistor connected in series at a second output node between the first and second reference voltages, each of the second pull-up and pull-down transistors having control terminals receiving a second differential switching control signals from the switched modulator, the second output node providing a second differential output signal to a second end of the load device;
a current direction detection circuit coupled to the first output of the switched modulator and the second output of the switched modulator to determine a direction of an output current and provide a current direction signal to indicate if the output current flows from the first output node to the second output node, or the output current flows from the second output node to the first output node;
first, second, third, and fourth slew control circuits, responsive to the current direction signal, and coupled to the first pull-up transistor, the first pull-down transistor, the second pull-up transistor, and the second pull-down transistor, respectively;
wherein:
the first slew control circuit is activated only during turnoff of the first pull-up transistor when the output current flows from the first output node to the second output node;
the second slew control circuit is activated only during turnoff of the first pull-down transistor when the output current flows from the second output node to the first output node;
the third slew control circuit is activated only during turnoff of the second pull-up transistor when the output current flows from the second output node to the first output node; and
the fourth slew control circuit is activated only during turnoff of the second pull-down transistor when the output current flows from the first output node to the second output node.

2. The switching amplifier circuit of claim 1, wherein a given slew control circuit is coupled to the control terminal of an output transistor, the slew control circuit including a current source coupled in series with parallelly connected first switch transistor and second switch transistor, wherein:
the first switch transistor has a control terminal coupled to a switching input signal; and
the second switch transistor has a control terminal that is coupled to either the switching input signal or a dynamically modulated switching signal that reduces a slew rate, depending on the current direction signal.

3. The switching amplifier circuit of claim 2, wherein the dynamically modulated switching input signal comprises the switching input signal and a first pulse signal determined by a high-pass filter coupled to the second output node.

4. The switching amplifier circuit of claim 3, wherein the second switch transistor is characterized by an on-resistance that is 25% of the on-resistance of the first switch transistor or lower.

5. The switching amplifier circuit of claim 3, wherein the second switch transistor is characterized by an on-resistance that is 50% of the on-resistance of the first switch transistor or lower.

6. The switching amplifier circuit of claim 3, wherein the given slew control circuit is a PMOS slew control circuit, in which the first and second switch transistors are PMOS transistors, and the PMOS slew control circuit further comprises:
an OR circuit having:
a first input node for receiving the switching input signal;
a second input node for receiving a current detection signal; and
an output node;
a p-channel MOS transistor having a drain node coupled to the output node of the OR circuit through a resistor;
a high-pass filter coupled between the output node of the output transistor and a gate node of the p-channel MOS transistor;
wherein the drain node of the p-channel MOS transistor provides the dynamically modulated switching input signal; and a multiplexer configured to select one of the input switching signal and dynamically modulated switching input signal in response to the current direction signal.

7. The switching amplifier circuit of claim 6, wherein:
the first pull-up transistor is a PMOS transistor; and
the first slew control circuit is a PMOS slew control circuit.

8. The switching amplifier circuit of claim 6, wherein:
the second pull-up transistor is a PMOS transistor; and
the second slew control circuit is a PMOS slew control circuit.

9. The switching amplifier circuit of claim 3, wherein the given slew control circuit is an NMOS slew control circuit, in which the first and second switch transistors are NMOS transistors, and the NMOS slew control circuit further comprises:
an AND circuit having:
a first input node for receiving the switching input signal;
a second input node for receiving a current detection signal; and
an output node;
an n-channel MOS transistor having a drain node coupled to the output node of the AND circuit through a resistor;
a high-pass filter coupled between the output node of the output transistor and a gate node of the n-channel MOS transistor;
wherein the drain node of the n-channel MOS transistor provides the dynamically modulated switching input signal; and
a multiplexer configured to select one of the input switching signal and dynamically modulated switching input signal in response to the current direction signal.

10. The switching amplifier circuit of claim 9, wherein:
the first pull-down transistor is an NMOS transistor; and
the third slew control circuit is an NMOS slew control circuit.

11. The switching amplifier circuit of claim 9, wherein:
the second pull-down transistor is an NMOS transistor; and
the fourth slew control circuit is an NMOS slew control circuit.

12. An output driver with slew rate control, comprising:
an output transistor including:
a control terminal coupled to a switching input signal;
a drain node coupled to an output node for coupling to a load device; and
a source node coupled to a reference voltage;
a slew control circuit including a current source coupled in series at a connection node with parallelly connected first switch transistor and second switch transistor, the connection node coupled to the control terminal of the output transistor; wherein:
the first switch transistor has a control terminal coupled to the switching input signal; and
the second switch transistor has a control terminal that is coupled to either the switching input signal or a dynamically modulated switching input signal, depending on a current direction at the output node.

13. The output driver of claim 12, wherein the dynamically modulated switching input signal comprises the switching input signal and a negative pulse signal determined by a high-pass filter coupled to the output node.

14. The output driver of claim 13, generating the dynamically modulated switching input by using delay cells and adding delays according to sensed output signal.

15. The output driver of claim 12, wherein the output transistor is an NMOS transistor and the slew control circuit further comprises:
an AND circuit having:
a first input node for receiving the switching input signal;
a second input node for receiving a current detection signal IL-Dir; and
an output node
an n-channel MOS transistor having a drain node coupled to the output node of the AND circuit through a resistor;
a high-pass filter coupled between the output node of the output transistor and a gate node of the n-channel MOS transistor;
wherein the drain node of the n-channel MOS transistor provides the dynamically modulated switching signal; and
a multiplexer circuit configured to select one of the input switching signal and the dynamically modulated switching input signal in response to the current direction at the output node.

16. The output driver of claim 12, wherein the output transistor is a PMOS transistor and the slew control circuit further comprises:
an OR circuit having:
a first input node for receiving the switching input signal;
a second input node for receiving a current detection signal; and
an output node;
a p-channel MOS transistor having a drain node coupled to the output node of the OR circuit through a resistor;
a high-pass filter coupled between the output node of the output transistor and a gate node of the p-channel MOS transistor;
wherein the drain node of the p-channel MOS transistor provides the dynamically modulated switching input signal; and
a multiplexer configured to select one of the input switching signal and dynamically modulated switching input signal in response to the current direction at the output node.

17. A method for operating an output driver, comprising:
controlling an output transistor with a switching input signal at a control terminal of the output transistor;
adjusting a turnoff current of the output transistor using a slew control circuit including a current source coupled in series at a connection node with parallelly connected first switch transistor and second switch transistor, the connection node coupled to the control terminal of the output transistor; wherein the adjusting includes:
turning on the first switch transistor using the switching input signal; and
turning on the second switch transistor using either the switching input signal or a dynamically modulated switching input signal, depending on a current direction at an output node of the output transistor.

18. The method of claim 17, further comprising forming the dynamically modulated switching input by modifying the switching input signal using a pulse signal determined by a high-pass filter coupled to the output node.

19. The method of claim 17, further comprising configuring the second switch transistor with an on-resistance that is 25% of the on-resistance of the first switch transistor or lower.

20. The method of claim 17, further comprising generating the dynamically modulated switching input by using delay cells and adding delays according to sensed output signal.

* * * * *